(12) United States Patent
Finn et al.

(10) Patent No.: US 6,310,778 B1
(45) Date of Patent: Oct. 30, 2001

(54) IC BOARD MODULE FOR PRODUCING AN IC BOARD AND PROCESS FOR PRODUCING AN IC BOARD

(76) Inventors: David Finn, König-Ludwig-Weg 24, Pfronten (DE), 87459; Manfred Rietzler, Am Alsterberg, Marktoberdorf (DE), 87616

( * ) Notice: Subject to any disclaimer, the term of this patent is extended or adjusted under 35 U.S.C. 154(b) by 0 days.

(21) Appl. No.: 09/043,531

(22) PCT Filed: Sep. 17, 1996

(86) PCT No.: PCT/DE96/01752

§ 371 Date: Mar. 18, 1998

§ 102(e) Date: Mar. 18, 1998

(87) PCT Pub. No.: WO97/11437

PCT Pub. Date: Mar. 27, 1997

(30) Foreign Application Priority Data

Sep. 18, 1995 (DE) .............................. 195 34 480

(51) Int. Cl.[7] ..................................................... H05K 1/14
(52) U.S. Cl. .......................... 361/737; 361/740; 361/747
(58) Field of Search .................................. 361/737, 740, 361/752, 747, 760, 761, 765, 768, 769, 777, 782, 803, 807, 811, 813; 235/492, 486, 487, 491, 488, 449, 441, 380; 257/678, 679

(56) References Cited

U.S. PATENT DOCUMENTS 5,598,032 * 1/1997 Fidalgo ................................. 257/679

FOREIGN PATENT DOCUMENTS

| | | |
|---|---|---|
| 38 86 721 T2 | 12/1988 | (DE) . |
| 41 05 869 A1 | 2/1991 | (DE) . |
| 43 11 493 A1 | 4/1993 | (DE) . |
| 44 31 754 C1 | 9/1994 | (DE) . |
| 0 140 230 | 5/1985 | (EP) . |
| 0 211 360 | 2/1987 | (EP) . |
| 0 646 895 | 4/1995 | (EP) . |
| WO 95/21423 | 8/1995 | (WO) . |

* cited by examiner

*Primary Examiner*—Jeffrey Gaffin
*Assistant Examiner*—Phuong T. Vu
(74) *Attorney, Agent, or Firm*—Darby & Darby

(57) ABSTRACT

An IC card module (20) for producing an IC card (118) having at least one coil (46) and at least one chip (23) for the formation of a transponder unit, with the chip and the coil being connected together by way of a module carrier (21) which renders possible not only an electrically conductive connection between the chip and the coil, but also an electrically conductive connection with an external contact face (38) of the module carrier and the chip, wherein the IC card module (20) has a retaining device (41) which is at a distance from the external contact face (38) by an offset R and projects laterally beyond the external contact face, and also a method for producing an IC card with use of such an IC card module.

12 Claims, 5 Drawing Sheets

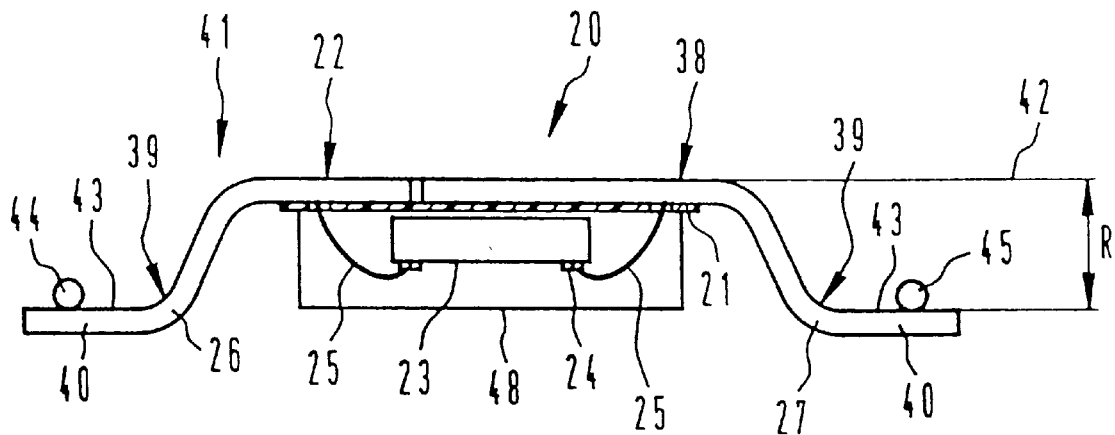
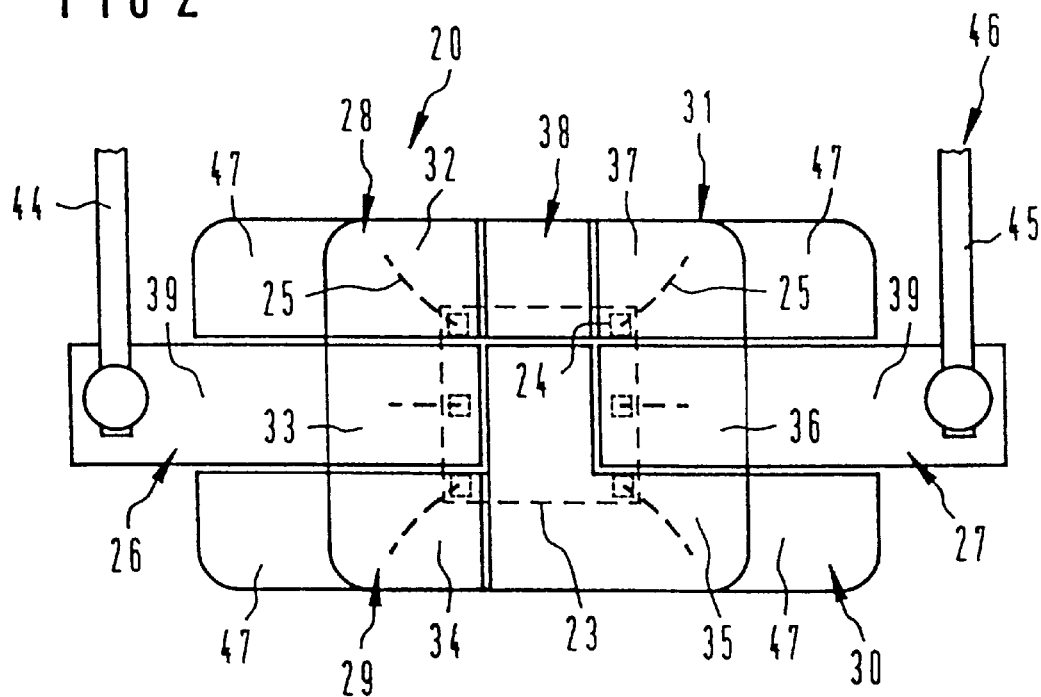

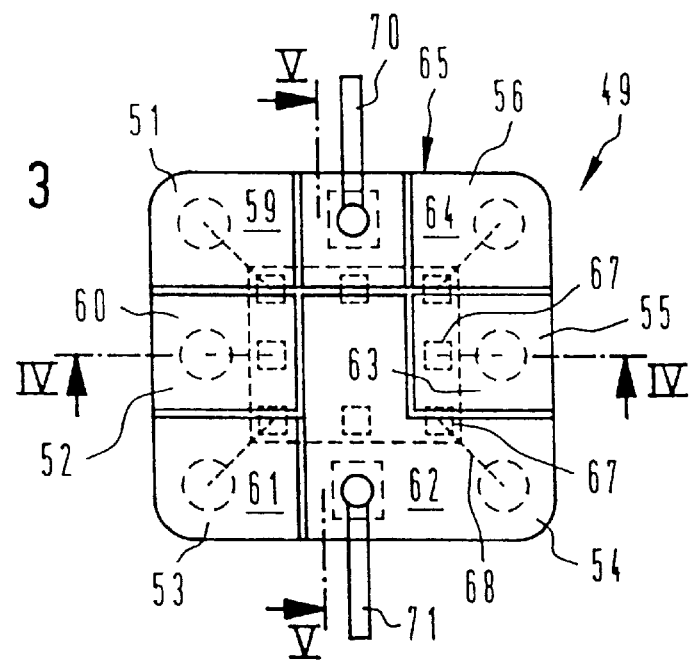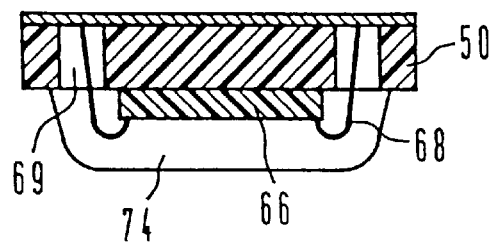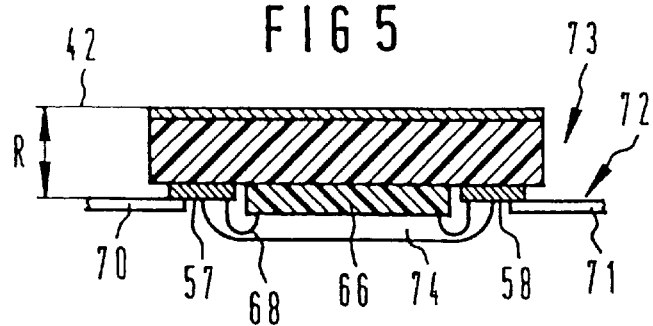

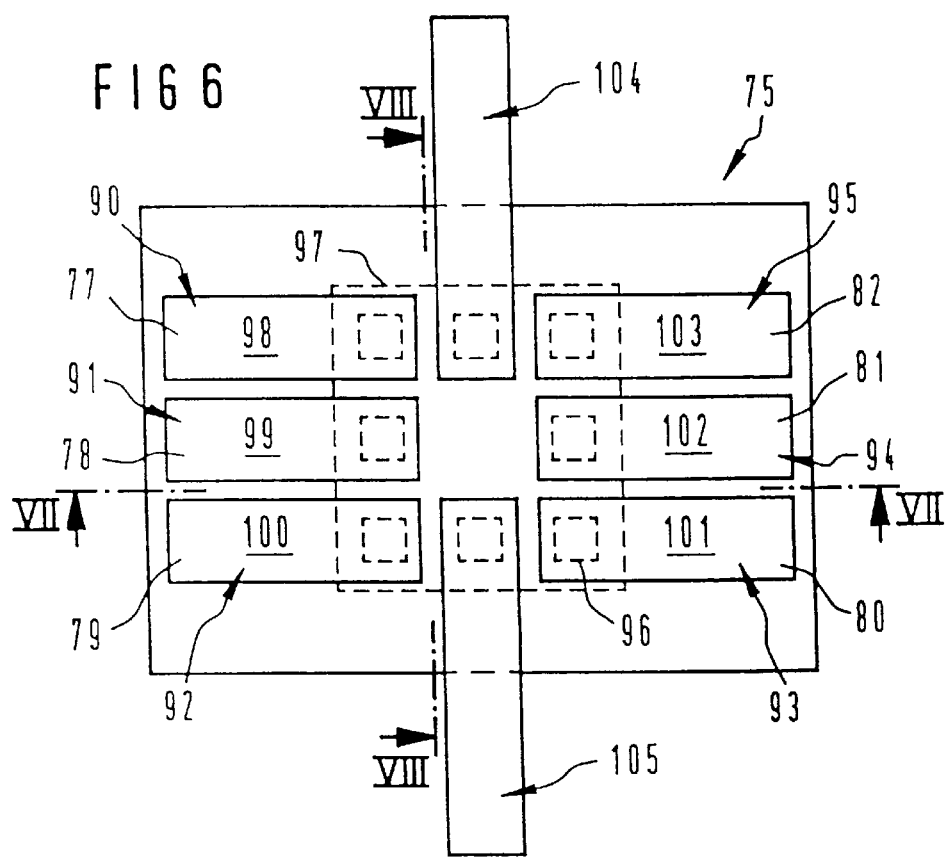
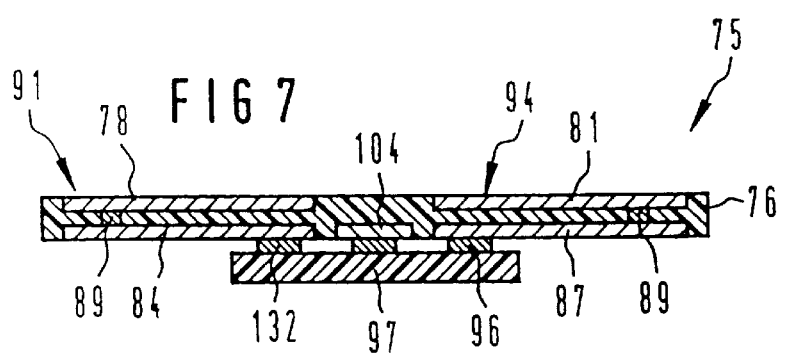
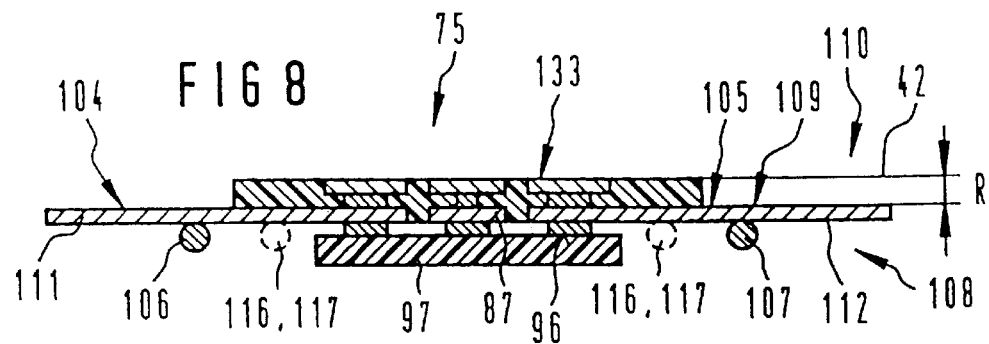

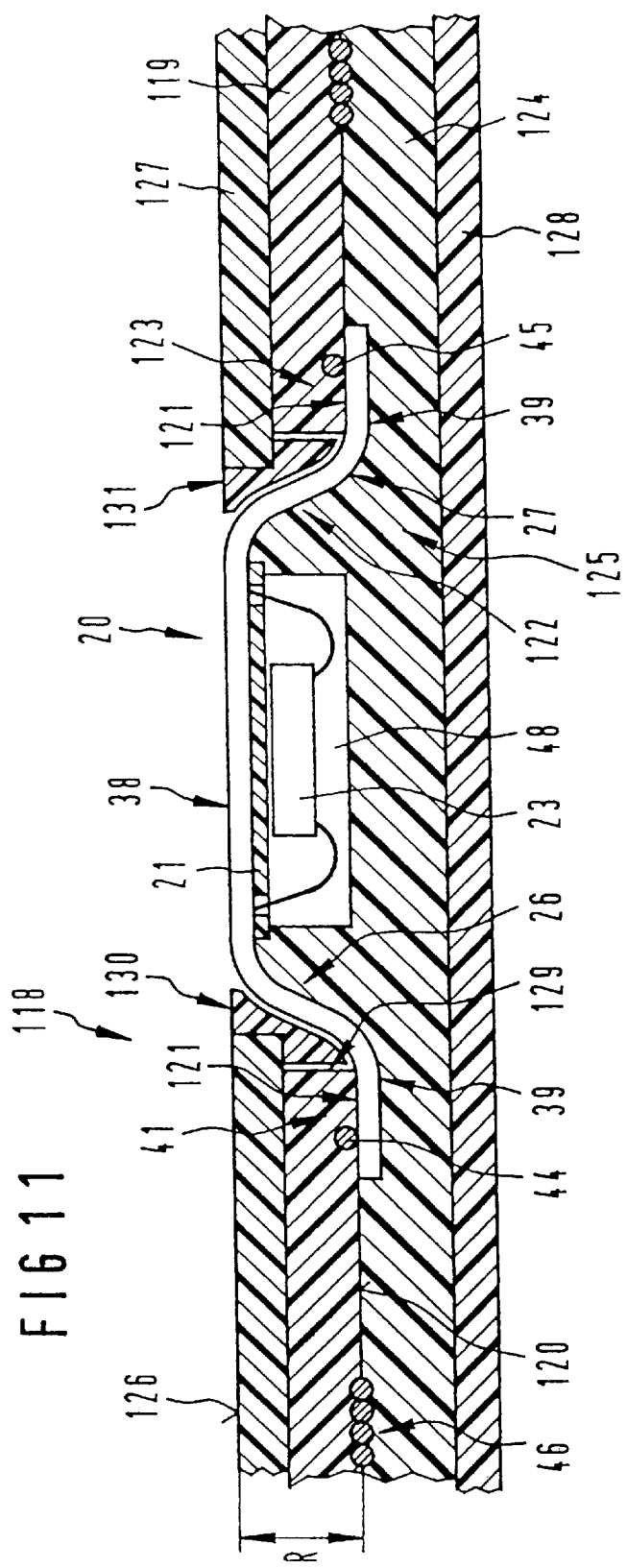

IC BOARD MODULE FOR PRODUCING AN IC BOARD AND PROCESS FOR PRODUCING AN IC BOARD

FIELD OF THE INVENTION

The present invention relates to an IC card module for producing an IC card for having at least one coil and at least one chip for the formation of a transponder unit, with the chip and the coil being connected together by way of a module carrier which not only has coil contact printed conductors for the purpose of establishing an electrically conductive connection between the chip and the coil, but also has external contact printed conductors for the purpose of establishing an electrically conductive connection between an external contact face of the module carrier and the chip, and with the IC card module having a retaining device for the purpose of securing the IC card module in a card body.

IC cards contain a chip as a data carrier that is installed in a card body and, depending on the design, render possible non-contact or contact- or touch-dependent access to the data carrier. Provided on the card carrier for touch-dependent contact there are contact fields which enable a connection to be established with correspondingly arranged contact points in a complementary device. Non-contact access to the data of the chip becomes possible if the latter is supplemented by a coil to form a transponder unit.

BACKGROUND OF THE INVENTION

An IC card module which can be inserted into a card body and which makes it possible to produce an IC card that renders possible not only contact-dependent access to the chip by way of contact fields, but also non-contact access to the chip by means of a coil supplementing the chip to form a transponder unit, is known from DE 43 11 493 A1. In this case, the chip and the coil are connected together by way of a module carrier which renders possible not only an electrically conductive connection between the chip and the coil, but also an electrically conductive connection between the chip and an external contact face of the module carrier that has contact fields.

Use of the IC card module, which is known from DE 43 11 493 A1, for the purpose of producing an IC card presupposes that a card body has been made available that is provided with a corresponding recess and into which the known IC card module can be inserted. The connection of the IC card module to the card body in a manner that is secure against loss must be carried out in a separate stage of manufacture that is independent of the production of the card body. The result of this, overall, is increased outlay when producing IC cards, in particular because the connection of the IC card module to the card body, which is effected by means of adhesion for example, must be carried out so that the result is that the external contact face of the IC card module is flush with the surface of the card body in order to guarantee operationally reliable use of such an IC card, for example in a cash dispenser.

An IC card module for producing an IC card, which is provided with two coils and a chip for the formation of a transponder unit, wherein the chip and the coils are connected together by way of a module carrier which not only has coil contact printed conductors for the purpose of establishing an electrically conductive connection between the chip and the coil, but also has external contact printed conductors for the purpose of establishing an electrically conductive connection between an external contact face of the module carrier and the chip, is known from DE-A-41 05 869. In the case of the known IC card module, a retaining device for the purpose of securing the IC card module in a card body is formed by the module carrier of the IC card module.

SUMMARY OF THE INVENTION

The underlying object of the present invention is to propose an IC card module for producing an IC card, which IC card module has a retaining device formation which is independent of the module carrier. Furthermore, it is the object of the present invention to propose an IC card which is provided with such an IC card module, and also a method for producing such an IC card.

For the purpose of achieving the object, an IC card module having the features of claims 1 or 2 as well as an IC card having the features of claim 13 or 14 are proposed.

In the case of a first card module in accordance with the invention, for the purpose of forming the retaining device the coil is arranged in relation to the module carrier in such a way that it extends at least in part beyond the surface of the external contact face. As a result, for the purpose of forming the retaining device it is not necessary to provide for the module carrier to be developed in a corresponding manner. On the contrary, the coil, which is connected to the module carrier anyway, is arranged so that it acts as the retaining device.

In the case of a second IC card module in accordance with the invention, the retaining device is formed from coil contact printed conductors of a printed-conductor structure that is arranged on the module carrier and which are used to establish the electrically conductive connection between the chip and the coil. In this case, namely those printed conductors which are required anyway to establish the electrical connection between the coil and the chip are used at the same time to form the cross-arm device so that the separate formation of a device that merely performs a retaining function becomes superfluous. In this connection, the coil contact printed conductors are arranged in such a way that they lie opposite external contact printed conductors for the purpose of establishing the electrically conductive connection between contact fields of the external contact face and the chip so that the offset, which is required for the use of the coil contact printed conductors as a retaining device, is there from the start without it being necessary to deform the latter.

Success in achieving an overall height of the IC card module that is as low as possible is also promoted by the fact that it is provided that coil wire ends of the coil be contacted with printed-conductor ends of the coil contact printed conductors on a contact face that faces an external contact face plane in which the external contact face is arranged.

Connecting chip terminal faces to the coil contact printed conductors and the external contact printed conductors by means of wire-bonding connections has the advantage that the connections between the printed conductors and the chip terminal faces can be orientated as desired.

When using contact metal coatings as a connection between the coil contact printed conductors and the chip terminal faces and also the external contact printed conductors and the chip terminal faces, it is possible to achieve substantially direct contact with correspondingly low overall height of the IC card module.

It also becomes possible to form the module carrier in a particularly compact manner if the external contact printed conductors are formed so that they verge into the contact fields, for example if the contact fields are formed by means of end regions of the external contact printed conductors.

In the case of an IC card which is produced with use of the IC card module described above in its various embodiments, the IC card module is arranged in a card body of the IC card in such a way that the external contact face, which is provided with at least one contact field, is arranged so as to be substantially flush with the surface of the IC card, and the retaining device of the IC card module engages behind a retaining area of the card body that is adjacent to the contact face.

In one embodiment of the IC card, the retaining area is part of a monolithically formed card body. In another embodiment, the retaining area is part of a carrier layer of a card body which is formed from at least two layers.

If the retaining device is received between the carrier layer and a counter-layer, with the retaining device being embedded at least in part in the carrier layer, the card body can be produced by means of the laminating process, in which case in a first method step it is possible to produce a unit that consists of the carrier layer and the IC card module and which can be handled with ease during further production of the IC card analogously to the way in which a laminated layer is handled. Alternatively, it is also possible to connect the retaining device to the carrier layer by way of an adhesive coating.

In a first variant of the method for producing an IC card with use of the IC card module which has been described in its various embodiments, the IC card module is inserted, with the external contact face, into a receiving opening of the carrier layer until the retaining device abuts against a connecting surface of the carrier layer, and the retaining device is connected to the carrier layer under the influence of pressure and temperature and/or ultrasound. Subsequently, the counter-layer is applied to the connecting surface of the carrier layer.

In another variant of the method for producing an IC card with use of the IC card module which has been described above in its various embodiments, a carrier layer having an opening in the region of the external contact face of the IC card module is formed on the retaining device in such a way that a connection is effected between the retaining device and the carrier layer. Subsequently, the counter-layer is applied to the carrier layer and a rear side of the IC card module that lies opposite the external contact face. This variant of the method makes it possible, for example, to produce the carrier layer by means of the injection-moulding process.

A further variant of the method for producing an IC card with use of the IC card module which has been described above in its various embodiments consists in forming the card body as a whole, with a recess in the region of the external contact face, on the retaining device. A monolithic card body can also be formed, for example, by means of the injection-moulding process.

Various embodiments of the IC card module as well as an IC card produced with use of an embodiment of the IC card module are described in greater detail in the following with reference to the drawings, in which:

FIG. 1 shows a first embodiment of an IC card module;

FIG. 2 shows a plan view of the IC card module which is represented in FIG. 1;

FIG. 3 shows a plan view of a further embodiment of an IC card module;

FIG. 4 shows the IC card module, which is represented in FIG. 3, in a sectional representation along the course of the line of intersection IV—IV in FIG. 3;

FIG. 5 shows a sectional representation of the IC card module, which is represented in FIG. 3, along the course of the line of intersection V—V in FIG. 3;

FIG. 6 shows a plan view of an IC card module according to a further embodiment;

FIG. 7 shows the IC card module, which is represented in FIG. 6, in a sectional representation along the course of the line of intersection VII—VII in FIG. 6;

FIG. 8 shows the IC card module, which is represented in FIG. 6, in a sectional representation along the course of the line of intersection VIII—VIII in FIG. 6;

FIG. 11 shows an IC card having an IC card module according to the embodiment which is represented in FIG. 1.

Figure 9:
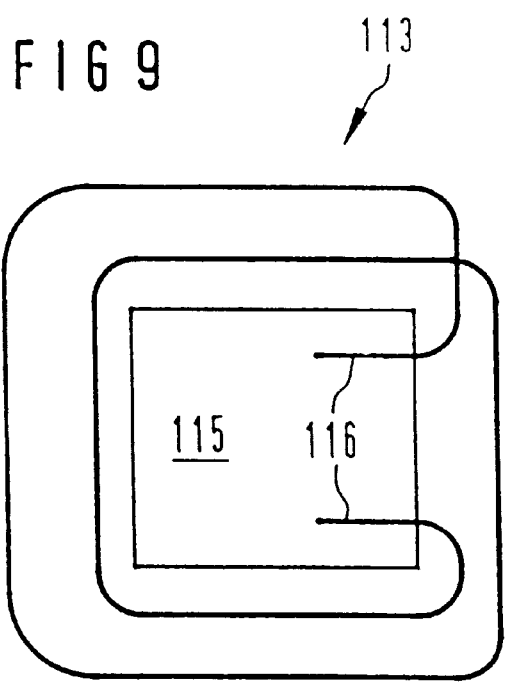
FIG. 9 shows a further embodiment of an IC card module.

FIGS. 1 and 2 show an IC card module 20 having a module carrier 21, which on its upper side is provided with a printed-conductor structure 22 and on the underside of which a chip 23 is arranged.

As becomes clear from FIG. 2, the chip 23, which is used here by way of example, has in total six chip terminal faces 24 which are connected by way of wire-bonding connections 25 to coil contact printed conductors 26, 27 and external contact printed conductors 28, 29, 30, 31.

In the present exemplary embodiment, both the coil contact printed conductors 26, 27 and the external contact printed conductors 28 to 31 extend in part along the upper side of the module carrier 21 where with their end regions they form contact fields 32 to 37, which are connected to a respective chip terminal face 24 by way of the wire-bonding connections 25.

As becomes clear from FIG. 1, the coil contact printed conductors 26, 27 have a respective protruding portion 39 which reaches beyond an external contact face 38 formed by the contact fields 32 to 37 and which in an end region 40 is at a distance from the external contact face 38 by an offset R. In the transition from the external contact face 38 to the end region 40, the protruding portion 39 of the coil contact printed conductors is formed in the shape of an S-twist.

The protruding portions 39 of the coil contact printed conductors 26, 27 formed in this way cooperate as a retaining device 41, the function of which will be explained further in detail below with reference to FIG. 11.

As can be seen, furthermore, from FIGS. 1 and 2, the end regions 40 of the coil contact printed conductors 26, 27 on a contact face 43, facing an external contact face plane 42, are connected in an electrically conducting manner—for example by means of a thermocompression connection—to coil wire ends 44, 45 of a coil 46 which is only represented incompletely here. Since the coil, in the present case, extends beyond the external contact face 38, it also forms a portion of the retaining device 41, something which will also be explained further in greater detail below with reference to FIG. 11.

In the case of the exemplary embodiment of the IC card module 20 which is represented in FIGS. 1 and 2, the external contact printed conductors 28 to 31, starting from the contact fields 32, 34, 35 and 37, also extend with protruding portions 47 beyond the external contact face 38 and in the same way as the protruding portions 39 of the coil contact printed conductors 26, 27 are also formed in the shape of an S-twist in order to form the offset R. Thus in the case of the IC card module 20 which is represented in FIGS. 1 and 2, the protruding portions 47 of the external contact printed conductors 28 to 31 also contribute to the formation of the retaining device 41.

In the case of the IC card module 20 which is represented in FIGS. 1 and 2, the coil contact printed conductors 26, 27, which by way of the wire-bonding connections 25 make it possible to effect an electrical connection of the coil 46 to the corresponding chip terminal faces, also have contact fields 33, 36 so that access to the corresponding chip terminal faces 24 can be effected not only in a contact-dependent manner by way of the contact fields 33 and 36, but also without contact by way of the coil 46. The external contact printed conductors 28 to 31 by way of the contact fields 32, 34, 35 and 37 merely render possible contact-dependent access to the corresponding chip terminal faces 24.

FIG. 1 shows that the chip 23, which is arranged on the underside of the module carrier 21 with its chip terminal faces 24 pointing downwards, is provided with an encapsulation 48 which shields both the chip 23 and the wire-bonding connections 25 leading from the chip terminal faces 24 to the coil contact printed conductors 26, 27 and the external contact printed conductors 28, 31.

In FIGS. 3, 4 and 5 an IC card module 49 is represented, in which IC card module external contact printed conductors 51 to 56 are arranged on the upper side of a module carrier 50 (FIGS. 4, 5) and coil contact printed conductors 57 and 58 are arranged on the underside (FIG. 5).

The external contact printed conductors 51 to 56 with their upper sides form in total six contact fields 59 to 64 and in the case of the exemplary embodiment represented here do not extend beyond an external contact face 65 of the IC card module 49.

As becomes clear from looking at FIGS. 3 and 4 together, a chip 66, which is arranged on the underside of the module carrier 50, has in total eight terminal faces 67, which are connected by way of respective wire-bonding connections 68 to the outer contact printed conductors 51 to 56. For this, the wire-bonding connections 68 are guided through bonding openings 69 (FIG. 4) in the module carrier 50. It is also possible to use through-connections, which are not represented further here, instead of the bonding openings 69 for the purpose of connecting the wire-bonding connections 68 to the external contact printed conductors 51 to 56.

As becomes clear from FIG. 5, the chip terminal faces 67 are also connected to the coil contact printed conductors 57, 58 by way of a respective wire-bonding connection 68. By means of a thermocompression connection for example, coil wire ends 70, 71 of a coil 72, which is only represented incompletely here, are connected to the coil contact printed conductors 57, 58. The coil wire ends 70, 71 extend outside the external contact face 65 and thus, together with the areas of the coil 72 that are also arranged outside the external contact face 65, form a retaining device 73 which in consequence of the arrangement of external contact printed conductors 51 to 56, on the one hand, and coil contact printed conductors 57 and 58, on the other hand, on opposite sides of the module carrier 50 is at a distance from the external contact face plane 42 by an offset R. As in the case of the IC card module 20, which was explained with reference to FIGS. 1 and 2, in the case of the IC card module 49 as well it is possible for both the chip 66 and the wire-bonding connections 68 to be shielded by means of an encapsulation 74.

In departure from the IC card module 20, explained at the beginning, access to the chip terminal faces 67, which are connected to the coil contact printed conductors 57, 58, is possible just without contact by way of the coil 72. In keeping with the IC card module 20, additionally in the case of the IC card module 49 access to the chip terminal faces 67 connected to the external contact printed conductors 51 to 56 is possible merely in a contact-dependent manner by way of the contact fields 59 to 64.

In FIGS. 6, 7 and 8, an IC card module 75 is represented that has a module carrier 76 (FIG. 7) and on its upper side and on its underside has external contact printed conductors 77 to 88 which form external contact conductors 90 to 95, connected together in each case in pairs by way of a through-connection 89 (FIG. 7), for connection to chip terminal faces 96 of a chip 97. The chip 97 in the present case by means of its chip terminal faces 96 by way of contact-metal coatings 132 is directly connected to the external contact conductors 90 to 95. The chip 97 can therefore be connected to the external contact conductors 90 to 95 using flip-chip technology known per se.

According to the exemplary embodiment represented in FIG. 7, the external contact printed conductors 77 to 82, which are arranged on the upper side of the module carrier 76, form contact fields 98 to 103 which render possible contact-dependent access to the chip terminal faces 96 which are connected to the external contact conductors 90 to 95.

As can be seen in addition from FIGS. 6 to 7, arranged on the underside of the module carrier 76 besides the external contact printed conductors 83 to 88 there are two coil contact printed conductors 104, 105 which, as can be seen in particular from FIG. 8, render possible an electrical connection between coil wire ends 106, 107 of a coil 108, which is only represented incompletely, and associated chip terminal faces 96 of the chip 97. The coil contact printed conductors 104, 105 have a protruding portion 109 which projects laterally beyond an external contact face 133 and which in relation to the external contact face plane 42 is arranged with an offset R and thus acts as a retaining device 110.

It can be seen from FIG. 8 that in the case of the IC card module 75 contact faces 111, 112 for connection with the coil wire ends 106 and 107 are turned away from the external contact face plane 42, the consequence of this being that the coil wire ends 106, 107 are essentially arranged in the plane of the chip 97 and despite the connection of the coil wire ends 106, 107 to the coil contact printed conductors 104, 105 a sufficient offset R remains that said coil contact printed conductors can act as a retaining device 110 in the region of their protruding portions 109. In addition, the embodiment which is represented in FIG. 8 has the advantage that the formation of a retaining device 110 is possible with an overall height of the IC card module 75 that is particularly low.

Figure 10:
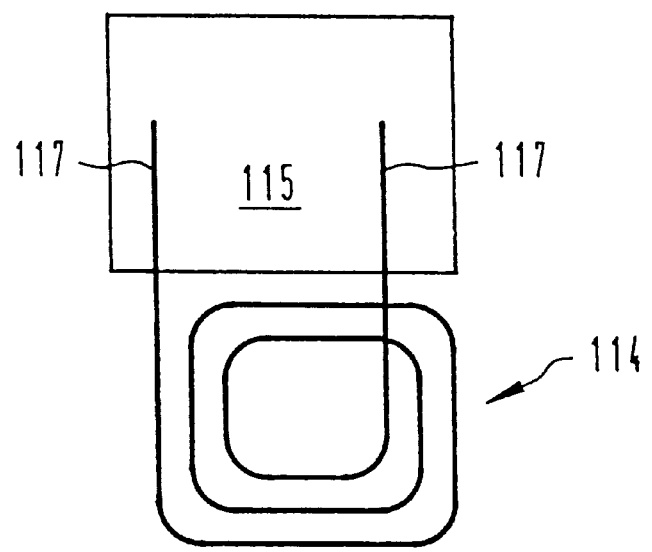
FIG. 10 shows a further embodiment of an IC card module.

In FIGS. 9 and 10 two exemplifying configurations of coils 113 (FIG. 9) and 114 (FIG. 10) are represented that render possible the formation of a retaining device for an IC card module 115 which, apart from the absence of the protruding portions 109, corresponds with the IC card module 75. The position of coil wire ends 116 and 117 respectively is represented by means of broken lines for this case in FIG. 8.

FIG. 11 shows an IC card 118 which has been produced with use of the IC card module 20 which has been explained by way of example with reference to FIG. 1. A possible method for producing the IC card 118 shall be explained in greater detail below with reference to FIG. 11.

Basing considerations on the IC card module 20, to the coil contact printed conductors 26, 27 of which the coil wire ends 44, 45 of the coil 46 are connected, in the first instance the IC card module 20 is connected to a carrier layer 119. The connection of the IC card module 20 to the carrier layer 119 is effected, on the one hand, by way of a form-locking connection of the coil 46 in the area of a connecting surface 120 of the carrier layer 119 and, on the other hand, also by way of the coil contact printed conductors 26, 27 in their zone 121 of contact with the connecting surface 120. In departure from the representation in FIG. 11, the depth of penetration of the coil 46 or the depth of penetration of the contact zones 121 of the coil contact printed conductors 26, 27 can vary between just a partial contact and almost complete embedding. The connection can be carried out, for example, by means of pressure and temperature, yet can be also be carried out under the influence of ultrasound. In departure from the representation in FIG. 11 it is also possible to arrange the retaining device 41, formed here by the coil contact printed conductors 26, 27 and the coil 46, not directly on the carrier layer, but to arrange it on the carrier layer by way of an adhesive coating, which is not represented here in greater detail, in which case the connecting surface is then formed at least in part by means of the adhesive coating.

For the purpose of establishing the connection, which is represented in FIG. 11, between the IC card module 20 and the carrier layer 119, the IC card module 20 can be introduced, with its external contact face 38, so far into an insertion opening 122 of the carrier layer 119 until the coil 46 and the coil contact printed conductor 26, 27 respectively abut against the connecting surface 120 and the actual connection can be effected.

The IC card module 20 together with the carrier layer 119 forms a card inlet 123 which as a unit can be processed further using conventional laminating technology to form the IC card 118 which is represented in FIG. 11. In this connection, it is possible to vary the sequence of the lamination processes which are described in the following by way of example. It is advantageous if starting from the card inlet 123 subsequently a counter-layer 124 is laminated onto the connecting surface 120 of the carrier layer 119 so that a card body 125 having a self-contained planar surface is formed as far as the external contact face 38 of the IC card module 20 that projects into the insertion opening 122. According to the formation of the carrier layer 119 and the counter-layer 124, the IC card 118 can be built up out of merely two layers in departure from the representation in FIG. 11. In this case, the carrier layer 119 is of such a thickness that the external contact face 38 of the IC card module 20 is flush with an external face 126 of the carrier layer 119.

In the case of the IC card 118 which is represented in FIG. 11, laminated onto the carrier layer 119 and the counter-layer 124 there are, furthermore, cover layers 127, 128 which can be formed as so-called personalization layers, that is, for example, layers provided with a photograph of the card holder and possible bibliographical data. A further possibility consists in the use of the cover layers as advertisement carriers or the like.

For the purpose of adapting layer edges 129 and 130 of the carrier layer 119 and the cover layer 127 to the area of the coil contact printed conductors 26, 27 formed in the shape of an S-twist, a filling 131 consisting of an adhesive or an encapsulating material can be provided in the area of the layer edges 129, 130. It is also possible to achieve such adaptation by means of thermoplastic deformation of the layer edges 129, 130, for example whilst establishing the connection between the IC card module 20 and the carrier layer 119 or the cover layer 127 respectively.

It becomes clear from the representation according to FIG. 11 that the protruding portions 39 of the coil contact printed conductors 26, 27 and also the coil 46 connected therewith act as a retaining device 41 or a connecting device which secures the IC card module 20 in the IC card 118. This function is achieved irrespective of the manner in which the IC card module 20 is produced. Thus in order to form the IC card module 20 it is also possible to apply the coil 46 to the connecting surface 120 of the carrier layer 119 in the first instance and effect a connection subsequently between the coil wire ends 44, 45 and the coil contact printed conductors 26, 27 in order to form the IC card module 20. In particular in this case the possibility is presented of forming the coil 46 as a so-called laying coil, this arising as a result of the fact that the coil wire is laid on the connecting surface 120 whilst forming the configuration of the coil.

The layer structure of the IC card 118, which is represented in FIG. 11, can also be effected by forming layers of coatings one on top of the other so that, for example, starting from a carrier layer which, as a unit or by using the injection-moulding method, is applied to the retaining device 41, the further layers are applied using injection-moulding technology.

What is claimed is:

1. An IC card module for producing an IC card having at least one coil and at least one chip for the formation of a transponder unit, with the chip and the coil being connected together by a module carrier having an external contact face said module carrier having coil contact printed conductors for the purpose of establishing an electrically conductive connection between the chip and the coil, and external contact printed conductors for the purpose of establishing an electrically conductive connection between said external contact face of the module carrier and the chip, each of said coil contact printed conductors having contact faces, and with the IC card module having a retaining means for retaining the IC card module in a card body, wherein for the purpose of forming the retaining means the coil is arranged in relation to the module carrier in such a way that it extends at least in part beyond the surface of the module carrier.

2. An IC card module according to claim 1, wherein coil wire ends of the coil are contacted with printed-conductor ends of the coil contact printed conductors on the contact face that faces an external contact face plane.

3. An IC card module according to claim 1 wherein wire-bonding connections are provided for the purpose of connecting chip terminal faces to the coil contact printed conductors and the external contact printed conductors.

4. A IC card module according to claim 1, wherein said chip is provided with chip terminal faces and the coil contact printed conductors and the chip terminal faces and also the external contact printed conductors and the chip terminal faces are connected together by contact metal coatings.

5. An IC card module according to claim 1, including contact fields, said external contact printed conductors being formed so that they verge into the contact fields.

6. An IC card module according to claim 5, wherein said contact fields are formed by end regions of the external contact printed conductors.

7. An IC card having an IC card module according to claim 1, wherein the IC card module is arranged in a card body of the IC card in such a way that the external contact face which is provided with at least one contact field is arranged so as to be substantially flush with the surface of the card body, and the retaining means of the IC card module engages behind a retaining area of the card body that is adjacent to the external contact face.

8. An IC card according to claim 7, wherein the retaining area is part of a monolithically formed card body.

9. An IC card according to claim 7, wherein the retaining area is part of a carrier layer of a card body wherein said card body is formed from at least two layers.

10. An IC card according to claim 9, wherein said retaining device is received between the carrier layer and a counter-layer with the retaining device being embedded at least in part in the carrier layer.

11. An IC card according to claim 9, wherein the retaining means is received between the carrier layer and a counter-layer with the retaining means being connected to the carrier layer by means of an adhesive coating.

12. An IC card module for producing an IC card having at least one coil and at least one chip for the formation of a transponder unit, with the chip and the coil being connected together by a module carrier which not only has coil contact printed conductors for the purpose of establishing an electrically conductive connection between the chip and the coil, but also has external contact printed conductors for the purpose of establishing an electrically conductive connection between an external contact face of the module carrier and the chip and with the IC card module having a retaining means for the purpose of retaining the IC card module in a card body wherein the coil contact printed conductors are arranged on the module carrier in such a way that they lie opposite the external contact printed conductors and the retaining device is formed by the coil contact printed conductors.

* * * * *